US012800616B2

(12) United States Patent
Murakami et al.

(10) Patent No.: US 12,800,616 B2
(45) Date of Patent: Nov. 17, 2026

(54) CURRENT MEASUREMENT APPARATUS

(71) Applicants: Yokogawa Electric Corporation, Musashino (JP); Yokogawa Test & Measurement Corporation, Hachioji (JP)

(72) Inventors: Kenji Murakami, Hachioji (JP); Nobuhiko Miyashita, Hachioji (JP)

(73) Assignees: Yokogawa Electric Corporation, Musashino (JP); Yokogawa Test & Measurement Corporation, Hachioji (JP)

( * ) Notice: Subject to any disclaimer, the term of this patent is extended or adjusted under 35 U.S.C. 154(b) by 153 days.

(21) Appl. No.: 18/776,655

(22) Filed: Jul. 18, 2024

(65) Prior Publication Data

US 2025/0076341 A1 Mar. 6, 2025

(30) Foreign Application Priority Data

Sep. 6, 2023 (JP) ................................. 2023-144755

(51) Int. Cl.
*G01R 1/20* (2006.01)
*G01R 13/02* (2006.01)
(Continued)

(52) U.S. Cl.
CPC ............... *G01R 1/20* (2013.01); *G01R 13/02* (2013.01); *G01R 19/0007* (2013.01); *H01F 27/006* (2013.01)

(58) Field of Classification Search
CPC . G01R 19/0092; G01R 15/183; G01R 15/185
See application file for complete search history.

(56) References Cited

U.S. PATENT DOCUMENTS

2012/0039062 A1* 2/2012 McBee ................ G01R 15/183 361/825
2012/0139527 A1* 6/2012 Teppan ................ G01R 15/185 324/127
(Continued)

FOREIGN PATENT DOCUMENTS

CN 219162235 U 6/2023
JP 2011128094 A 6/2011
(Continued)

OTHER PUBLICATIONS

Extended European Search Report dated Jan. 27, 2025, issued in counterpart EP Application No. 24190133.9. (10 pages).
(Continued)

*Primary Examiner* — Huy Q Phan
*Assistant Examiner* — Temilade S Rhodes-Vivour
(74) *Attorney, Agent, or Firm* — WHDA, LLP

(57) ABSTRACT

A tracking current is separated easily. A current measurement apparatus 10 according to the present disclosure is configured to measure a tracking current. The current measurement apparatus 10 includes a magnetic core 11 that can be disposed so as to enclose wiring 100 to be measured, and first and second coils L1 and L2 wound on the magnetic core 11. The number of turns of the second coil L2 is smaller than that of the first coil L1. The second coil L2 is configured to be able to detect the tracking current flowing through the wiring 100.

11 Claims, 7 Drawing Sheets

(51) Int. Cl.
*G01R 19/00* (2006.01)
*H01F 27/00* (2006.01)

(56) References Cited

U.S. PATENT DOCUMENTS

| | | | | |
|---|---|---|---|---|
| 2012/0194171 | A1* | 8/2012 | Blakely | G01R 15/185 324/117 R |
| 2015/0108967 | A1* | 4/2015 | Barczyk | G01R 15/185 324/202 |
| 2015/0160298 | A1* | 6/2015 | Tabatowski-Bush | G01R 15/183 324/426 |
| 2019/0190251 | A1* | 6/2019 | Corzine | H03K 17/687 |

FOREIGN PATENT DOCUMENTS

| | | | |
|---|---|---|---|
| JP | 2012-8139 | A | 1/2012 |
| JP | 2019-164082 | A | 9/2019 |
| JP | 2021-120665 | A | 8/2021 |

OTHER PUBLICATIONS

Yagi, M. et al, Analysis of Surface Current Characteristics Flowing on Cord Plug Surface in Accelerated Tracking Test, IEEE Transactions on Dielectrics and Electrical Insulation, vol. 15, No. 3, Jun. 2008, p. 756-762. (7 pages); cited in Extended European Search Report dated Jan. 27, 2025.

Office Action dated Mar. 25, 2025, issued in counterpart JP Application No. 2023-144755, with English translation. (6 pages).

* cited by examiner

CURRENT MEASUREMENT APPARATUS

CROSS-REFERENCE TO RELATED APPLICATION

This application claims priority to Japanese Patent Application No. 2023-144755, filed on Sep. 6, 2023, the entire contents of which are incorporated herein by reference.

TECHNICAL FIELD

The present disclosure relates to a current measurement apparatus.

BACKGROUND

When dust or the like accumulates between electrodes in each of plugs that are plugged into outlets, current may flow between the electrodes through the dust or the like. Such current flowing through the dust or the like between the electrodes in each plug is generally referred to as tracking current.

When the tracking current continues to flow, short circuits may occur between the electrodes and cause fires. Since the tracking current can cause the fires, as described above, it is important to detect the tracking current.

For example, Patent Literature (PTL) 1 discloses a tracking current detection apparatus that determines whether a tracking current is flowing, by performing arithmetic processing on a measured load current and comparing a calculation result with a predetermined condition.

CITATION LIST

Patent Literature

PTL 1: JP 2012-8139 A

SUMMARY

A current measurement apparatus according to some embodiments is a current measurement apparatus configured to measure a tracking current, the current measurement apparatus including a magnetic core that can be disposed so as to enclose wiring to be measured, and first and second coils wound on the magnetic core, wherein the number of turns of the second coil is smaller than the number of turns of the first coil, and the second coil is configured to be able to detect the tracking current flowing through the wiring.

DETAILED DESCRIPTION

Figure 7:
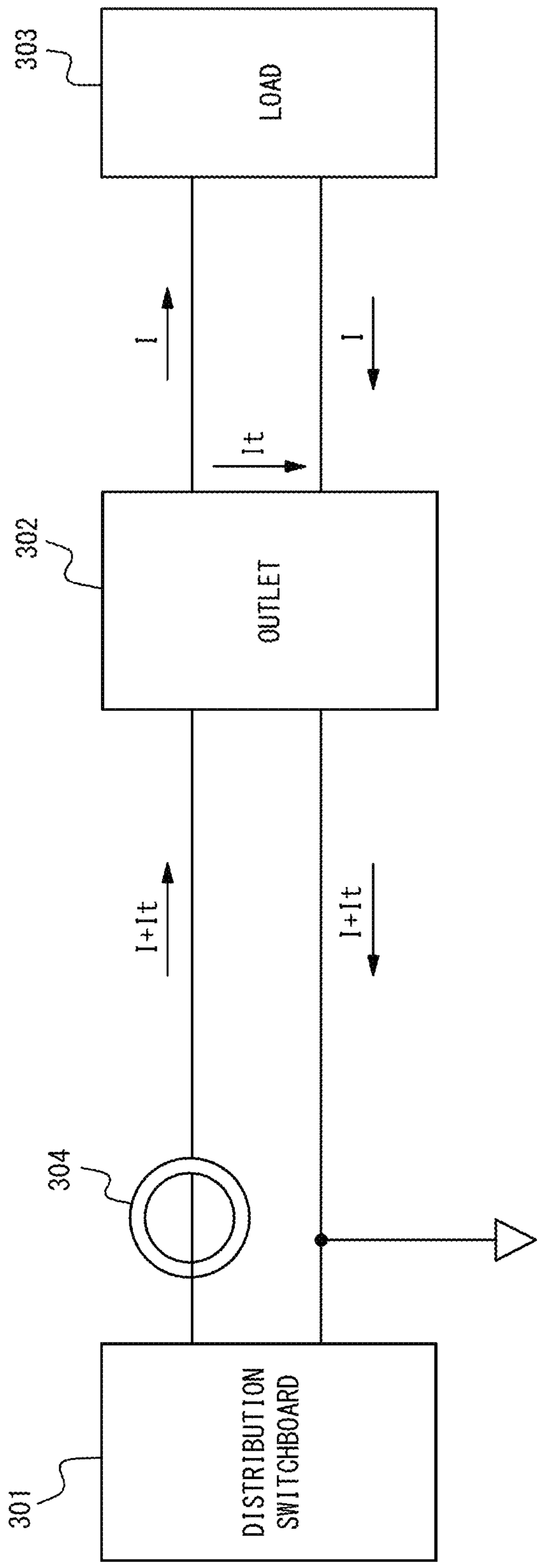
FIG. 7 is a diagram illustrating an example of conventional tracking current measurement.

FIG. 7 illustrates an example of a state in which a tracking current is flowing. In the example illustrated in FIG. 7, electric power is supplied from a distribution switchboard 301 to an outlet 302, and the electric power is supplied from the outlet 302 to a load 303. The load 303 is an electrical device or the like.

In the example illustrated in FIG. 7, a load current I is flowing through the load 303. Also, a tracking current It is flowing through the outlet 302.

In this case, a current of I+It, which is the sum of the load current and the tracking current, flows from the distribution switchboard 301 to the outlet 302.

To detect the tracking current, for example, it is conceivable to measure, by a current sensor 304, a current flowing from the distribution switchboard 301 to the outlet 302. In this case, the current sensor 304 detects the current I+It, which is the sum of the load current and the tracking current.

Usually, the load current is much larger than the tracking current. For example, when the load current I is 10 A and the tracking current It is 100 mA, the current detected by the current sensor 304 is 10.1 A. This current is almost the same as the load current of 10 A when no tracking current is flowing. Therefore, it is difficult to separate a current for the tracking current, from a measurement result of the current sensor 304.

It would be helpful to provide a current measurement apparatus that can easily separate a tracking current.

A current measurement apparatus according to some embodiments is a current measurement apparatus configured to measure a tracking current, the current measurement apparatus including a magnetic core that can be disposed so as to enclose wiring to be measured, and first and second coils wound on the magnetic core, wherein the number of turns of the second coil is smaller than the number of turns of the first coil, and the second coil is configured to be able to detect the tracking current flowing through the wiring. Such a current measurement apparatus can easily separate the tracking current.

In the current measurement apparatus according to one of the embodiments, the first coil may be configured to be able to detect a commercial power frequency current flowing through the wiring. Therefore, the commercial power frequency current can be detected.

The current measurement apparatus according to the one of the embodiments may further include a first current measurement circuit configured to measure the commercial power frequency current detected by the first coil, and a second current measurement circuit configured to measure the tracking current detected by the second coil. Therefore, the commercial power frequency current and the tracking current can be measured.

The current measurement apparatus according to the one of the embodiments may further include a controller and a display, wherein the controller may be configured to control the display to display the commercial power frequency current measured by the first current measurement circuit and the tracking current measured by the second current measurement circuit. This allows a user to easily check the commercial power frequency current and the tracking current.

The current measurement apparatus according to one of the embodiments may further include an amplifier circuit configured to amplify an output current of the second coil, and a low-pass filter configured to output a commercial power frequency current, among an output current of the amplifier circuit, wherein an output current of the low-pass filter may be fed back to the first coil. This can cancel out a magnetic field caused by the commercial power frequency current.

The current measurement apparatus according to the one of the embodiments may further include a first current measurement circuit configured to measure the output current of the low-pass filter, and a second current measurement circuit configured to measure the tracking current detected by the second coil. Therefore, the commercial power frequency current and the tracking current can be measured.

The current measurement apparatus according to the one of the embodiments may further include a controller and a display, wherein the controller may be configured to control the display to display the output current of the low-pass filter measured by the first current measurement circuit and the tracking current measured by the second current measurement circuit. This allows a user to easily check the commercial power frequency current and the tracking current.

In the current measurement apparatus according to the one of the embodiments, the second coil may be configured to be able to detect the commercial power frequency current, as well as the tracking current.

In the current measurement apparatus according to one of the embodiments, the number of turns of the second coil may be equal to or smaller than 1/100 of the number of turns of the first coil. Therefore, the second coil can detect the tracking current.

In the current measurement apparatus according to one of the embodiments, the magnetic core may be configured in the shape of a ring.

In the current measurement apparatus according to one of the embodiments, the magnetic core may be configured to be partly openable and closable. This allows the magnetic core to catch the wiring to be measured.

According to the present disclosure, it is possible to provide the current measurement apparatus that can easily separate the tracking current.

Embodiments of the present disclosure will be described below with reference to the drawings.

First Embodiment

Figure 1:
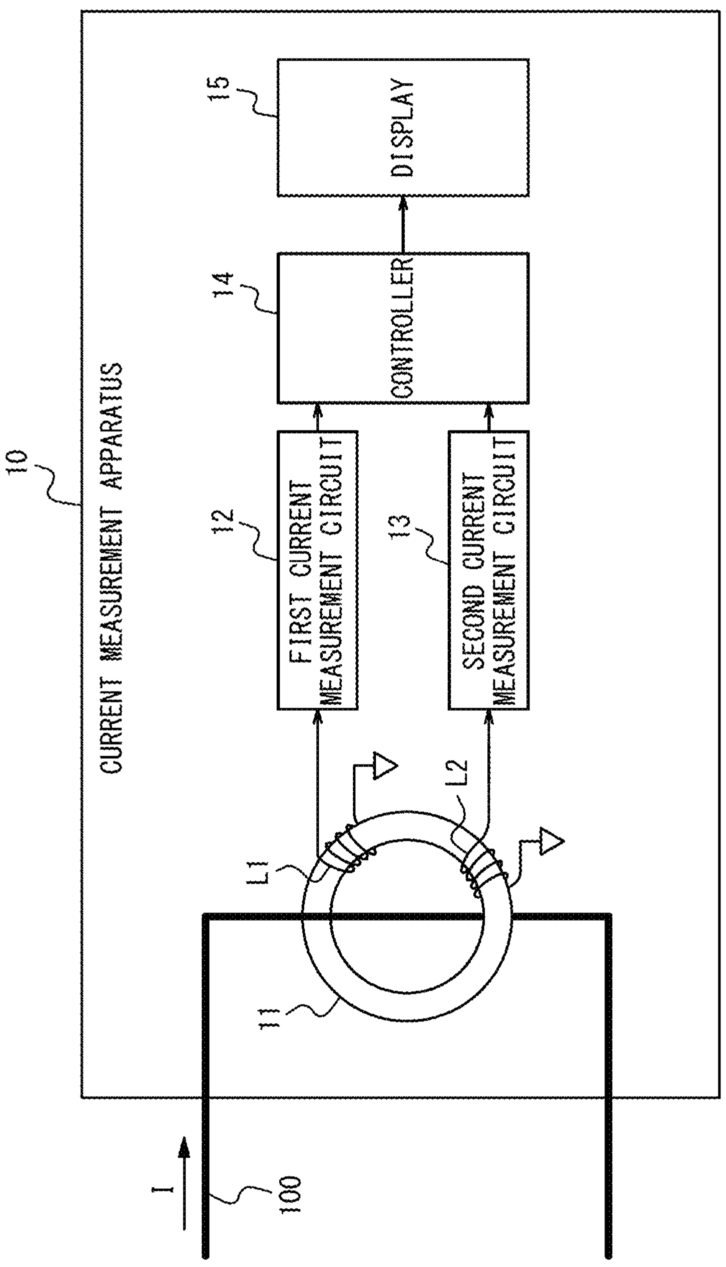
FIG. 1 is a schematic configuration diagram of a current measurement apparatus according to a first embodiment.

FIG. 1 is a schematic configuration diagram of a current measurement apparatus 10 according to a first embodiment.

The current measurement apparatus 10 is an apparatus that measures a tracking current. FIG. 1 illustrates a state in which the current measurement apparatus 10 measures a current I that flows through wiring 100 to be measured. The wiring 100 may be, for example, wiring that connects between a distribution switchboard and an outlet.

The current measurement apparatus 10 can measure the tracking current by separating the current flowing through the wiring 100 into a commercial power frequency current and the tracking current.

The commercial power frequency current is a current that flows through a load, such as an electrical device connected to the outlet, at a low frequency e.g. 50 Hz or 60 Hz.

The tracking current is a pulse current that flows between electrodes of a plug, which is plugged into the outlet, through dust or the like, at a high frequency. The frequency of the tracking current is of the order of, for example, several hundred kHz, which is much higher than the frequency of the commercial power frequency current.

The current measurement apparatus 10 includes a magnetic core 11, a first coil L1, a second coil L2, a first current measurement circuit 12, a second current measurement circuit 13, a controller 14, and a display 15.

The magnetic core 11 can be disposed so as to enclose the wiring 100 to be measured. The magnetic core 11 may be in the shape of a ring, for example. The magnetic core 11 may be configured to be partly openable and closable. Due to the partly openable and closeable configuration, the magnetic core 11 can catch the wiring 100.

The first coil L1 is a coil wound on the magnetic core 11. The first coil L1 can detect the commercial power frequency current flowing through the wiring 100 caught by the magnetic core 11.

The second coil L2 is a coil wound on the magnetic core 11. The number of turns of the second coil L2 is smaller than that of the first coil L1. The second coil L2 can detect the tracking current flowing through the wiring 100 caught by the magnetic core 11.

The number of turns of the second coil L2 is equal to or smaller than 1/100 of the number of turns of the first coil L1. As an example, the number of turns of the first coil L1 may be 4000, and the number of turns of the second coil L2 may be 4 or the like. In this case, the number of turns of the second coil L2 is 1/1000 of the number of turns of the first coil L1.

The principle of the first coil L1 detecting the commercial power frequency current flowing through the wiring 100 and the second coil L2 detecting the tracking current flowing through the wiring 100 will be described with reference to FIG. 2.

Figure 2:
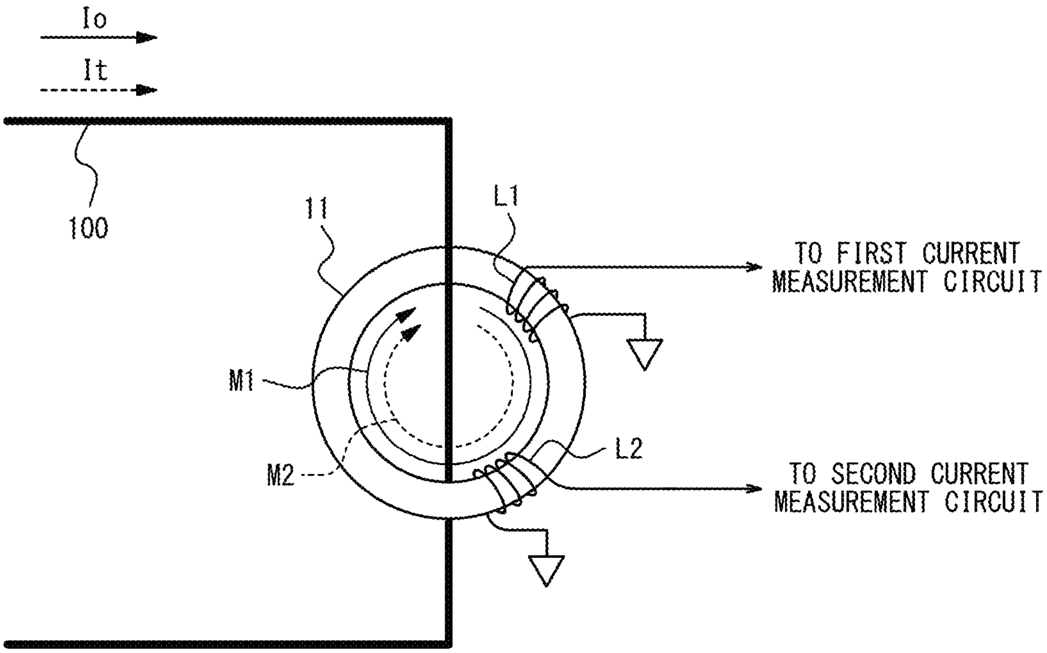
FIG. 2 is a diagram illustrating a principle by which the current measurement apparatus according to the first embodiment detects currents.

In the example illustrated in FIG. 2, a commercial power frequency current Io and a tracking current It flow through the wiring 100 in a superimposed manner. At this time, a magnetic field M1 is generated around the wiring 100 due to the commercial power frequency current Io. In addition, a magnetic field M2 is generated around the wiring 100 due to the tracking current It.

At this time, current flows through the first and second coils L1 and L2 to cancel out the magnetic fields M1 and M2.

First, current to cancel out the magnetic field M1 caused by the commercial power frequency current Io is considered. The current to cancel out the magnetic field M1 flows through both the first and second coils L1 and L2. A current flowing through the second coil L2 is much smaller than a current flowing through the first coil L1 because the number of turns of the first coil L1 is much larger than that of the second coil L2. For example, when the number of turns of the second coil L2 is 1/1000 of the number of turns of the first coil L1, the current flowing through the second coil L2 is 1/1000 of the current flowing through the first coil L1. Therefore, the commercial power frequency current Io can be detected by detecting the current flowing through the first coil L1.

Next, current to cancel out the magnetic field M2 caused by the tracking current It is considered. The tracking current It is a current at a high frequency such as several hundred kHz. Therefore, in order to cancel out the magnetic field M2, it is necessary to pass high frequency current through the first and second coils L1 and L2. However, the first coil L1, which has a large number of turns and a large inductance component, can hardly carry the high frequency current. On the other hand, the second coil L2, which has a small number of turns and a small inductance component, can carry the high frequency current.

Therefore, the current to cancel out the magnetic field M2 caused by the tracking current It flows through the second coil L2. Therefore, the tracking current It can be detected by detecting a current flowing through the second coil L2.

Returning again to FIG. 1, the explanation is continued.

The first current measurement circuit 12 is connected to the first coil L1. To the first current measurement circuit 12, the commercial power frequency current detected by the first coil L1 is input. Thus, the first current measurement circuit 12 can measure the commercial power frequency current detected by the first coil L1. The first current measurement circuit 12 outputs, to the controller 14, a signal corresponding to the measured commercial power frequency current. The first current measurement circuit 12 may output the signal corresponding to the measured commercial power frequency current, as a current or as a voltage.

The second current measurement circuit 13 is connected to the second coil L2. To the second current measurement circuit 13, the tracking current detected by the second coil L2 is input. Thus, the second current measurement circuit 13 can measure the tracking current detected by the second coil L2. The second current measurement circuit 13 outputs, to the controller 14, a signal corresponding to the measured tracking current. The second current measurement circuit 13 may output the signal corresponding to the measured tracking current, as a current or as a voltage.

The controller 14 controls the entire current measurement apparatus 10 and each block of the current measurement apparatus 10. The controller 14 includes at least one processor, at least one dedicated circuit, or a combination thereof. The processor is a general purpose processor such as a central processing unit (CPU) or graphics processing unit (GPU), or a dedicated processor specialized for particular processing. The dedicated circuit is, for example, a field-programmable gate array (FPGA) or application specific integrated circuit (ASIC).

The controller 14 acquires, from the first current measurement circuit 12, the signal corresponding to the commercial power frequency current measured by the first current measurement circuit 12. The controller 14 acquires, from the second current measurement circuit 13, the signal corresponding to the tracking current measured by the second current measurement circuit 13.

The controller 14 controls the display 15 to display the commercial power frequency current measured by the first current measurement circuit 12 and the tracking current measured by the second current measurement circuit 13.

The display 15 can display various types of data. The display 15 may include, for example, a liquid crystal display (LCD), an organic electro luminescent (EL) display, or the like.

Figure 3:
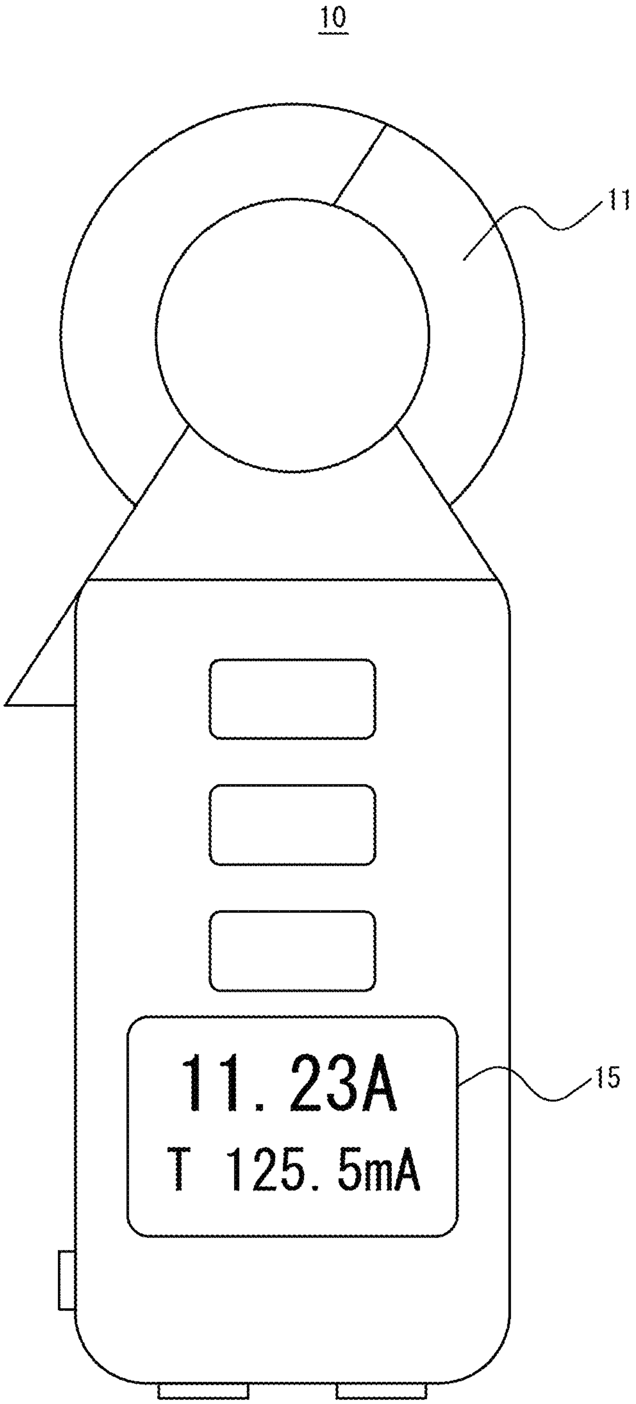
FIG. 3 is a diagram illustrating an example of the appearance of the current measurement apparatus according to the first embodiment.

FIG. 3 is a diagram illustrating an example of the appearance of the current measurement apparatus 10 according to the first embodiment. FIG. 3 illustrates the example in which the current measurement apparatus 10 is a clamp-type current measurement apparatus.

In the configuration illustrated in FIG. 3, the magnetic core 11 is partly openable and closable. The magnetic core 11 can catch the wiring 100 to be measured.

In the example illustrated in FIG. 3, the display 15 is displaying the following values, as the commercial power frequency current and the tracking current.

Commercial Power Frequency Current: 11.23 A

Tracking Current: 125.5 mA

As described above, the current measurement apparatus 10 according to the first embodiment can easily separate the tracking current. More specifically, the current measurement apparatus 10 includes the first and second coils L1 and L2 wound on the magnetic core 11. The number of turns of the second coil L2 is smaller than that of the first coil L1. Therefore, the first coil L1, which has the large number of turns, detects the commercial power frequency current, and the second coil L2, which has the small number of turns, detects the tracking current. Since the first coil L1 with the large number of turns detects the commercial power frequency current and the second coil L2 with the small number of turns detects the tracking current, the current measurement apparatus 10 according to the first embodiment can easily separate the tracking current.

Second Embodiment

Figure 4:
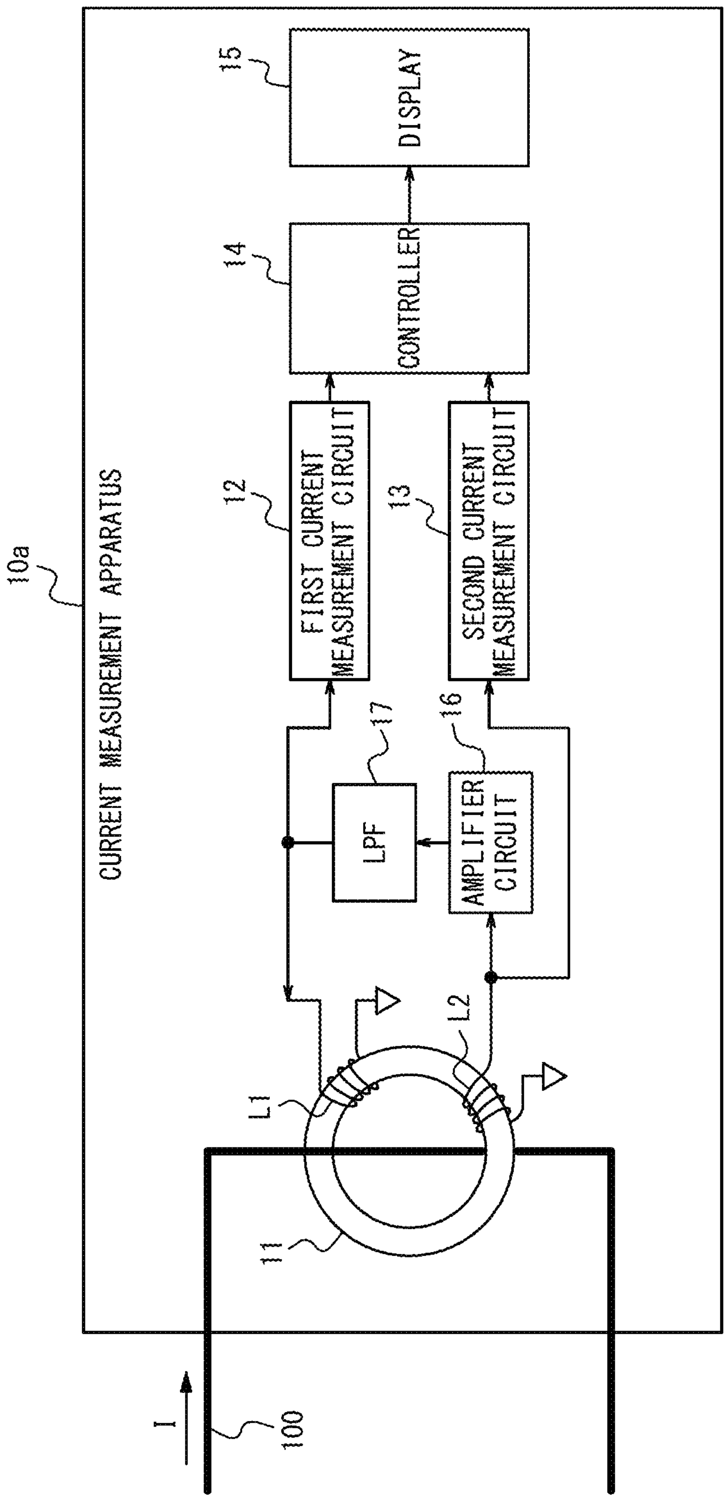
FIG. 4 is a schematic configuration diagram of a current measurement apparatus according to a second embodiment.

FIG. 4 is a schematic configuration diagram of a current measurement apparatus 10*a* according to a second embodiment.

The current measurement apparatus 10*a* according to the second embodiment is also an apparatus that measures a tracking current, as well as the current measurement apparatus 10 according to the first embodiment.

The current measurement apparatus 10*a* according to the second embodiment includes a magnetic core 11, a first coil L1, a second coil L2, a first current measurement circuit 12, a second current measurement circuit 13, a controller 14, a display 15, an amplifier circuit 16, and a low-pass filter (LPF) 17.

The current measurement apparatus 10*a* according to the second embodiment differs from the current measurement apparatus 10 according to the first embodiment illustrated in FIG. 1, mainly in that the current measurement apparatus 10*a* has the amplifier circuit 16 and the low-pass filter 17.

The current measurement apparatus 10*a* according to the second embodiment will be described mainly in terms of differences from the current measurement apparatus 10 according to the first embodiment. Common or similar points to the current measurement apparatus 10 according to the first embodiment are omitted from the description as appropriate.

The first coil L1 is a coil wound on the magnetic core 11.

The second coil L2 is a coil wound on the magnetic core 11. The number of turns of the second coil L2 is smaller than that of the first coil L1. The second coil L2 can detect the tracking current flowing through the wiring 100 caught by the magnetic core 11. The second coil L2 can also detect, along with the tracking current, a commercial power frequency current flowing through the wiring 100 caught by the magnetic core 11.

The amplifier circuit 16 is connected to the second coil L2. To the amplifier circuit 16, an output current of the second coil L2 is input. The output current of the second coil L2 includes the commercial power frequency current and the tracking current, which are detected by the second coil L2.

The amplifier circuit 16 amplifies the output current of the second coil L2, and outputs an amplified output current to the low-pass filter 17.

The low-pass filter 17 passes and outputs a low frequency current, among the output current of the amplifier circuit 16. In other words, the low-pass filter 17 passes the commercial power frequency current, among the output current of the amplifier circuit 16, and hardly passes the tracking current, among the output current of the amplifier circuit 16. The low-pass filter 17 may be a low-pass filter of any configuration configured to have such a frequency characteristic.

The output current of the amplifier circuit 16 contains the commercial power frequency current, which is a low frequency current, and the tracking current, which is a high frequency current. The low-pass filter 17 outputs only the commercial power frequency current, which is the low frequency current.

The output current of the low-pass filter 17 is supplied to the first coil L1. In other words, the commercial power frequency current in the output current of the low-pass filter 17 is fed back to the first coil L1.

When the commercial power frequency current is fed back to the first coil L1, as described above, a magnetic field generated by the commercial power frequency current flowing through the wiring 100 and a magnetic field generated by the commercial power frequency current fed back to the first coil L1 cancel out each other.

Then, the magnetic field generated by the commercial power frequency current flowing through the wiring 100 is greatly reduced, and only a magnetic field generated by the tracking current flowing through the wiring 100 remains mainly. Thus, almost only a current to cancel out the magnetic field generated by the tracking current flows through the second coil L2. Therefore, the second coil L2 can detect the tracking current.

The first current measurement circuit 12 is connected to the low-pass filter 17. The first current measurement circuit 12 can measure the output current of the low-pass filter 17. Since the output current of the low-pass filter 17 contains the commercial power frequency current, the first current measurement circuit 12 can measure the commercial power frequency current. The first current measurement circuit 12 outputs, to the controller 14, a signal corresponding to the measured commercial power frequency current. The first current measurement circuit 12 may output the signal corresponding to the measured commercial power frequency current, as a current or as a voltage.

The second current measurement circuit 13 is connected to the second coil L2. To the second current measurement circuit 13, the tracking current detected by the second coil L2 is input. Thus, the second current measurement circuit 13 can measure the tracking current detected by the second coil L2. The second current measurement circuit 13 outputs, to the controller 14, a signal corresponding to the measured tracking current. The second current measurement circuit 13 may output the signal corresponding to the measured tracking current, as a current or as a voltage.

As described above, the current measurement apparatus 10*a* according to the second embodiment can also easily separate the tracking current. More specifically, the current measurement apparatus 10*a* according to the second embodiment includes the first and second coils L1 and L2 wound on the magnetic core 11, the amplifier circuit 16 that amplifies the output current of the second coil L2, and the low-pass filter 17 that outputs the commercial power frequency current, among the output current of the amplifier circuit 16. The output current of the low-pass filter 17 is fed back to the first coil L1. As a result, the magnetic field generated by the commercial power frequency current flowing through the wiring 100 and the magnetic field generated by the commercial power frequency current fed back to the first coil L1 cancel out each other. Therefore, since the second coil L2 can detect only the tracking current, the current measurement apparatus 10*a* according to the second embodiment can easily separate the tracking current.

Third Embodiment

Figure 5:
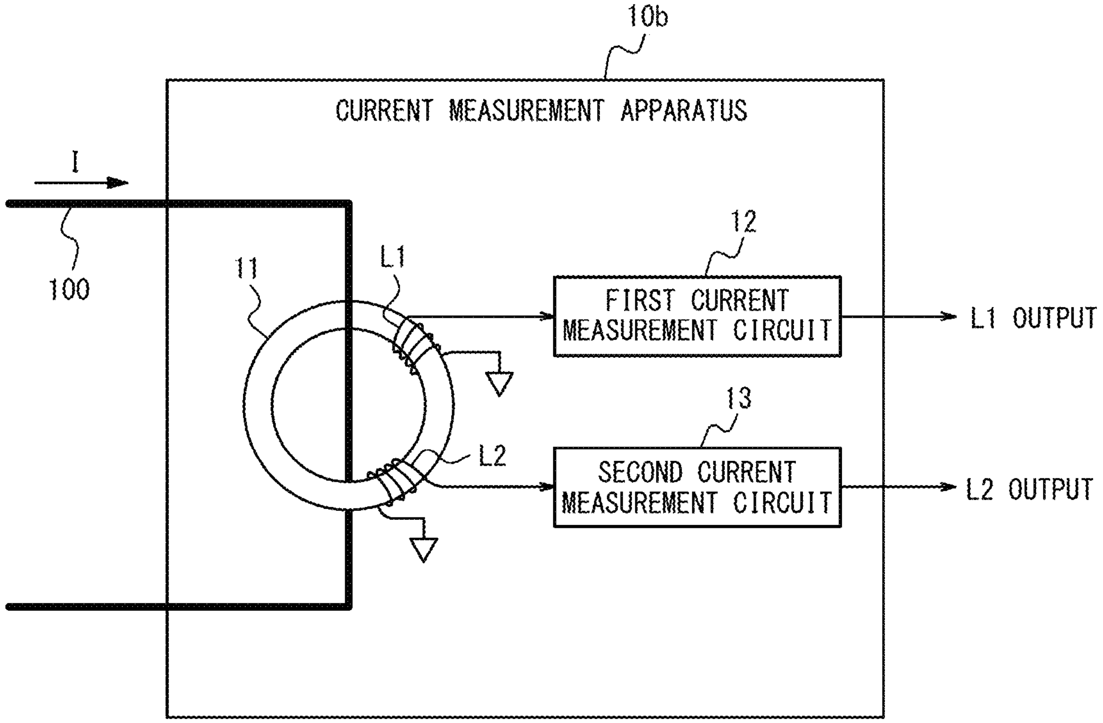
FIG. 5 is a schematic configuration diagram of a current measurement apparatus according to a third embodiment.

FIG. 5 is a schematic configuration diagram of a current measurement apparatus 10*b* according to a third embodiment.

The current measurement apparatus 10*b* according to the third embodiment is also an apparatus that measures a tracking current, as well as the current measurement apparatus 10 according to the first embodiment.

The current measurement apparatus 10*b* according to the third embodiment includes a magnetic core 11, a first coil L1, a second coil L2, a first current measurement circuit 12, and a second current measurement circuit 13.

The current measurement apparatus 10*b* according to the third embodiment differs from the current measurement apparatus 10 according to the first embodiment illustrated in FIG. 1, mainly in that the current measurement apparatus 10*b* does not include a controller 14 and a display 15.

The current measurement apparatus 10*b* according to the third embodiment is mainly described in terms of the differences from the current measurement apparatus 10 according to the first embodiment. Common or similar points to the current measurement apparatus 10 according to the first embodiment are omitted from the description as appropriate.

As described above, the current measurement apparatus 10*b* according to the third embodiment does not include the controller 14 and the display 15. Therefore, the current measurement apparatus 10*b* according to the third embodiment can be configured in a simple configuration without a power supply, because there is no need to power the controller 14 and the display 15.

Figure 6:
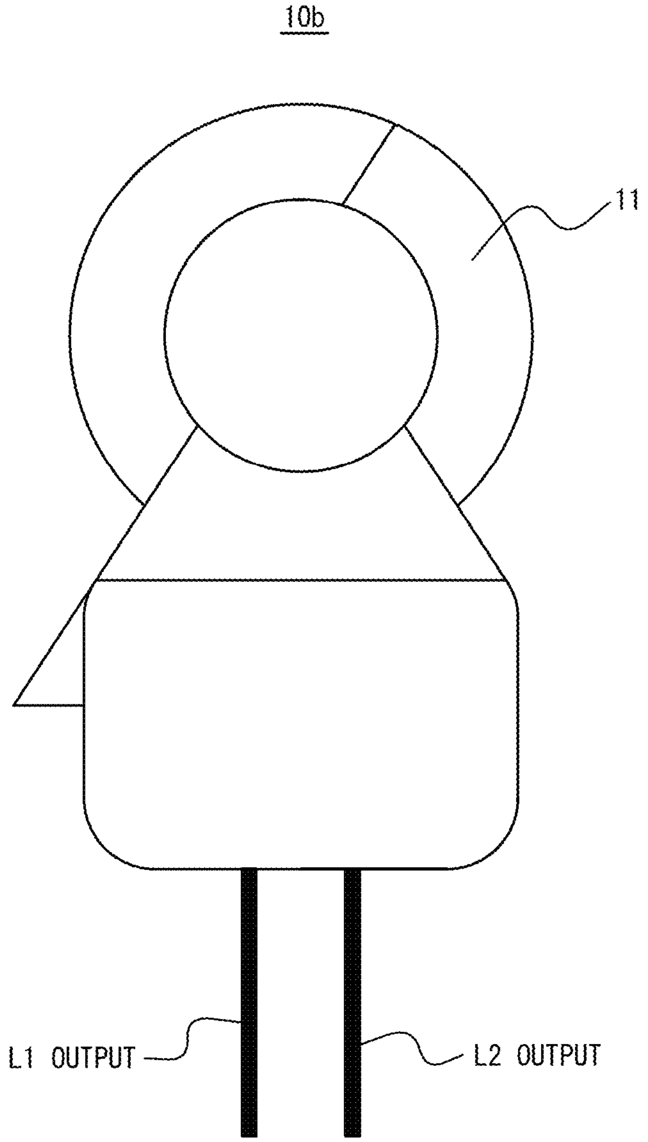
FIG. 6 is a diagram illustrating an example of the appearance of the current measurement apparatus according to the third embodiment.

FIG. 6 illustrates an example of the appearance of the current measurement apparatus 10*b* according to the third embodiment. FIG. 6 illustrates the example in which the current measurement apparatus 10*b* is a clamp-type probe.

In the configuration illustrated in FIG. 6, the magnetic core 11 is partly openable and closable. The magnetic core 11 can catch wiring 100 to be measured.

In the configuration illustrated in FIG. 6, the current measurement apparatus 10*b* according to the third embodiment may supply, to an external apparatus, an L1 output of the first current measurement circuit 12 and an L2 output of the second current measurement circuit 13. In this case, the external apparatus, to which the L1 and L2 outputs of the current measurement apparatus 10*b* according to the third embodiment are connected, may display a commercial power frequency current and the tracking current.

The current measurement apparatus 10*b* according to the third embodiment corresponds to the current measurement apparatus 10 according to the first embodiment without the controller 14 and the display 15, but it is equally possible to configure the current measurement apparatus 10*a* according to the second embodiment without the controller 14 and the display 15.

It is obvious to those skilled in the art that the present disclosure can be realized in other predetermined forms than the embodiments described above, without departing from its spirit or its essential features. Accordingly, the preceding description is illustrative and not limiting. The scope of the disclosure is defined by the appended claims, not by the preceding description. Some modifications which are within the scope of their equivalents among all modifications are encompassed therein.

For example, the arrangement and number of each component described above are not limited to those illustrated in the above description and drawings. The arrangement and number of each component may be configured arbitrarily as long as the function can be realized.

For example, the above embodiments illustrate the configurations in which one first coil L1 is wound on the magnetic core 11. However, multiple first coils L1 may be wound on the magnetic core 11. For example, when four first coils L1 are wound on the magnetic core 11 at equal intervals, an error due to a measurement position can be reduced, thus enabling the first coils L1 to detect a current with even higher accuracy.

For example, the above embodiments illustrate the configurations in which one second coil L2 is wound on the magnetic core 11. However, multiple second coils L2 may be wound on the magnetic core 11. For example, when two second coils L2 are wound on the magnetic core 11 at equal intervals, an error due to a measurement position can be reduced, thus enabling the second coils L2 to detect a current with even higher accuracy.

For example, the above embodiments illustrate the configurations in which the first and second coils L1 and L2 are wound on the magnetic core 11. However, a third coil L3 may be further wound on the magnetic core 11. By adjusting the number of turns of the third coil L3, the third coil L3 may be configured to be able to separate and detect inverter noise or the like.

For example, the above embodiments illustrate the configurations in which the current measurement apparatuses 10 and 10*a* can measure the commercial power frequency current and the tracking current. However, the current measurement apparatuses 10 and 10*a* may further include a magnetic core and a coil that can measure a leakage current (Io), a resistance component leakage current (Ior), or the like.

For example, the above embodiments illustrate the second coil L2 that detects the tracking current. However, by adjusting the number of turns of the second coil L2, the second coil L2 may be able to separate and detect a harmonic.

The invention claimed is:

1. A current measurement apparatus configured to measure a tracking current, the current measurement apparatus comprising:

a magnetic core that is disposed so as to enclose wiring to be measured; and first and second coils wound on the magnetic core, wherein the number of turns of the second coil is smaller than the number of turns of the first coil, the first coil is configured to detect a commercial power frequency current flowing through the wiring, and the second coil is configured to detect the tracking current flowing through the wiring.

2. The current measurement apparatus according to claim 1, further comprising:

a first current measurement circuit configured to measure the commercial power frequency current detected by the first coil; and a second current measurement circuit configured to measure the tracking current detected by the second coil.

3. The current measurement apparatus according to claim 2, further comprising:

a controller; and a display, wherein the controller is configured to control the display to display the commercial power frequency current measured by the first current measurement circuit and the tracking current measured by the second current measurement circuit.

4. The current measurement apparatus according to claim 1, further comprising:

an amplifier circuit configured to amplify an output current of the second coil; and a low-pass filter configured to output a commercial power frequency current, among an output current of the amplifier circuit, wherein an output current of the low-pass filter is fed back to the first coil.

5. The current measurement apparatus according to claim 4, further comprising:

a first current measurement circuit configured to measure the output current of the low-pass filter; and a second current measurement circuit configured to measure the tracking current detected by the second coil.

6. The current measurement apparatus according to claim 5, further comprising:

a controller; and a display, wherein the controller is configured to control the display to display the output current of the low-pass filter measured by the first current measurement circuit and the tracking current measured by the second current measurement circuit.

7. The current measurement apparatus according to claim 4, wherein the second coil is configured to be able to detect the commercial power frequency current, as well as the tracking current.

8. The current measurement apparatus according to claim 1, wherein the number of turns of the second coil is equal to or smaller than 1/100 of the number of turns of the first coil.

9. The current measurement apparatus according to claim 1, wherein the magnetic core is configured in shape of a ring.

10. The current measurement apparatus according to claim 1, wherein the magnetic core is configured to be partly openable and closable.

11. The current measurement apparatus according to claim 1, wherein a frequency of the tracking current is higher than a frequency of the commercial power frequency current.

* * * * *